US010826386B2

(12) United States Patent
Liu et al.

(10) Patent No.: US 10,826,386 B2
(45) Date of Patent: Nov. 3, 2020

(54) MULTI-STAGE CHARGE PUMP REGULATION ARCHITECTURE

(71) Applicant: NXP B.V., Eindhoven (NL)

(72) Inventors: Xiaoqun Liu, Chandler, AZ (US); Madan Mohan Reddy Vemula, Tempe, AZ (US)

(73) Assignee: NXP B.V., Eindhoven (NL)

( * ) Notice: Subject to any disclaimer, the term of this patent is extended or adjusted under 35 U.S.C. 154(b) by 13 days.

(21) Appl. No.: 16/172,464

(22) Filed: Oct. 26, 2018

(65) Prior Publication Data

US 2020/0136502 A1    Apr. 30, 2020

(51) Int. Cl.
*H02M 3/07* (2006.01)
*H02M 1/08* (2006.01)
*H03K 17/06* (2006.01)
*H02M 1/32* (2007.01)

(52) U.S. Cl.
CPC ............... *H02M 3/07* (2013.01); *H02M 1/08* (2013.01); *H02M 1/32* (2013.01); *H03K 17/06* (2013.01)

(58) Field of Classification Search
CPC ............. H02M 3/07; H02M 2003/071; H02M 2003/072; H02M 3/073; H02M 2003/075–078
See application file for complete search history.

(56) References Cited

U.S. PATENT DOCUMENTS

| 8,598,854 B2* | 12/2013 | Soenen | G05F 1/575 |
| | | | 323/269 |
| 2015/0295564 A1* | 10/2015 | Jones, Jr. | H03K 5/156 |
| | | | 327/175 |
| 2015/0349092 A1* | 12/2015 | Denison | H01L 29/7801 |
| | | | 438/268 |
| 2019/0214973 A1* | 7/2019 | Choi | H02M 1/08 |

OTHER PUBLICATIONS

Abdi, Alfian et al; "A High-Voltage Generation Charge-Pump IC using Input Voltage Modulated Regulation for Neural Implant Devices", IEEE Transactions on Circuits and Systems II—Express Briefs, 5 pages. (2018 Early Access).
Allasasmeh, Younis et al, "Fast-Startup High-Efficiency Tripler Charge Pump in Standard 0.18-μm CMOS Technology", IEEE International Symposium on Circuits and Systems, pp. 1-5 (2018).

* cited by examiner

*Primary Examiner* — Patrick C Chen

(57) ABSTRACT

A multi-stage charge pump including a first stage configured to generate a first output voltage, a last stage configured to receive the first output voltage from the first stage and output a second output voltage, a switch configured to receive the second output voltage from the last stage, and a voltage regulator circuit configured to control the second output voltage of the last stage to maintain a substantially constant on-resistance of the switch.

18 Claims, 3 Drawing Sheets

MULTI-STAGE CHARGE PUMP REGULATION ARCHITECTURE

TECHNICAL FIELD

Various example embodiments described herein relate to charge pump circuits, and more particularly to a multi-stage charge pump regulation architecture configured to regulate a gate-source bias-voltage for power switches and data switches. The architecture may be used to achieve a substantially fixed on-resistance (Rdson) across a wide power supply voltage range.

SUMMARY

A brief summary of various example embodiments is presented below. Some simplifications and omissions may be made in the following summary, which is intended to highlight and introduce some aspects of the various example embodiments, but not to limit the scope of the invention. Detailed descriptions of example embodiments adequate to allow those of ordinary skill in the art to make and use the inventive concepts will follow in later sections.

Example embodiments include a multi-stage charge pump including a first stage configured to generate a first output voltage, a last stage configured to receive the first output voltage from the first stage and output a second output voltage, a switch configured to receive the second output voltage from the last stage, and a voltage regulator circuit configured to control the second output voltage of the last stage to maintain a substantially constant on-resistance of the switch.

The multi-stage charge pump voltage regulator circuit may include a comparator configured to compare the difference between the second output voltage and a reference voltage to an output voltage of the switch.

The comparator may include first and second NMOS transistors, and first and second PMOS transistors.

The comparator may include a cascode configuration of transistors configured to add at least one of additional accuracy and less variation to the multi-stage charge pump.

The comparator may include a plurality of extended drain transistors configured to withstand a high output voltage from the last stage.

The comparator may output a high signal to enable the last stage of the multi-stage charge pump when the comparator determines that the difference between the second output voltage and the reference voltage is less than the output voltage of the switch.

The comparator may output a low signal to disable the last stage of the multi-stage charge pump when the comparator determines that the difference between the second output voltage and the reference voltage is greater than the output voltage of the switch.

An AND gate may be configured to receive an output from the voltage regulator and a clock signal.

Example embodiments include a method of regulating an output voltage of a multi-stage charge pump including generating a first output voltage using a first stage of the multi-stage charge pump, generating a second output voltage using a last stage of the multi-stage charge pump, outputting the second output voltage to a switch, and comparing the difference between the second output voltage and a reference voltage to an output voltage of the switch to determine whether a last stage of the multi-stage output is enabled.

When the difference between the compared output voltage of the multi-stage charge pump and the reference voltage is less than the output voltage of the switch, a high signal may be produced to enable the last stage of the multi-stage charge pump.

When the difference between the compared output voltage of the multi-stage charge pump and the reference voltage is greater than the output voltage of the switch, a low signal may be produced to disable the last stage of the multi-stage charge pump.

The method may include generating an alternating on and off signal from a voltage regulator to alternately enable and disable the last stage and produce a substantially constant gate-source voltage of the switch over time.

The method may include receiving the alternating on and off signal into an AND gate to alternately enable and disable the last stage.

Example embodiments also include a method of operating a multi-stage charge pump including generating a first output voltage using a first stage, receiving the first output voltage from the first stage and outputting a second output voltage by a last stage, receiving the second output voltage from the last stage to control a switch, and controlling the second output voltage of the last stage using a voltage regulator to maintain a substantially constant on-resistance of the switch.

The method may include comparing the difference between the second output voltage and a reference voltage to an output voltage of the switch using a comparator.

The comparator may include first and second NMOS transistors, and first and second PMOS transistors.

The comparator may include a cascode configuration of transistors configured to add at least one of additional accuracy and less variation to the multi-stage charge pump.

The method may include outputting a high signal to enable the last stage of the multi-stage charge pump when a comparator determines that the difference between the second output voltage and the reference voltage is less than the output voltage of the switch.

The method may include outputting a low signal to disable the last stage of the multi-stage charge pump when it is determined that the difference between the second output voltage and the reference voltage is greater than the output voltage of the switch.

The method may include receiving an output from the voltage regulator and a clock signal into a logic gate.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

DETAILED DESCRIPTION

Figure 1:
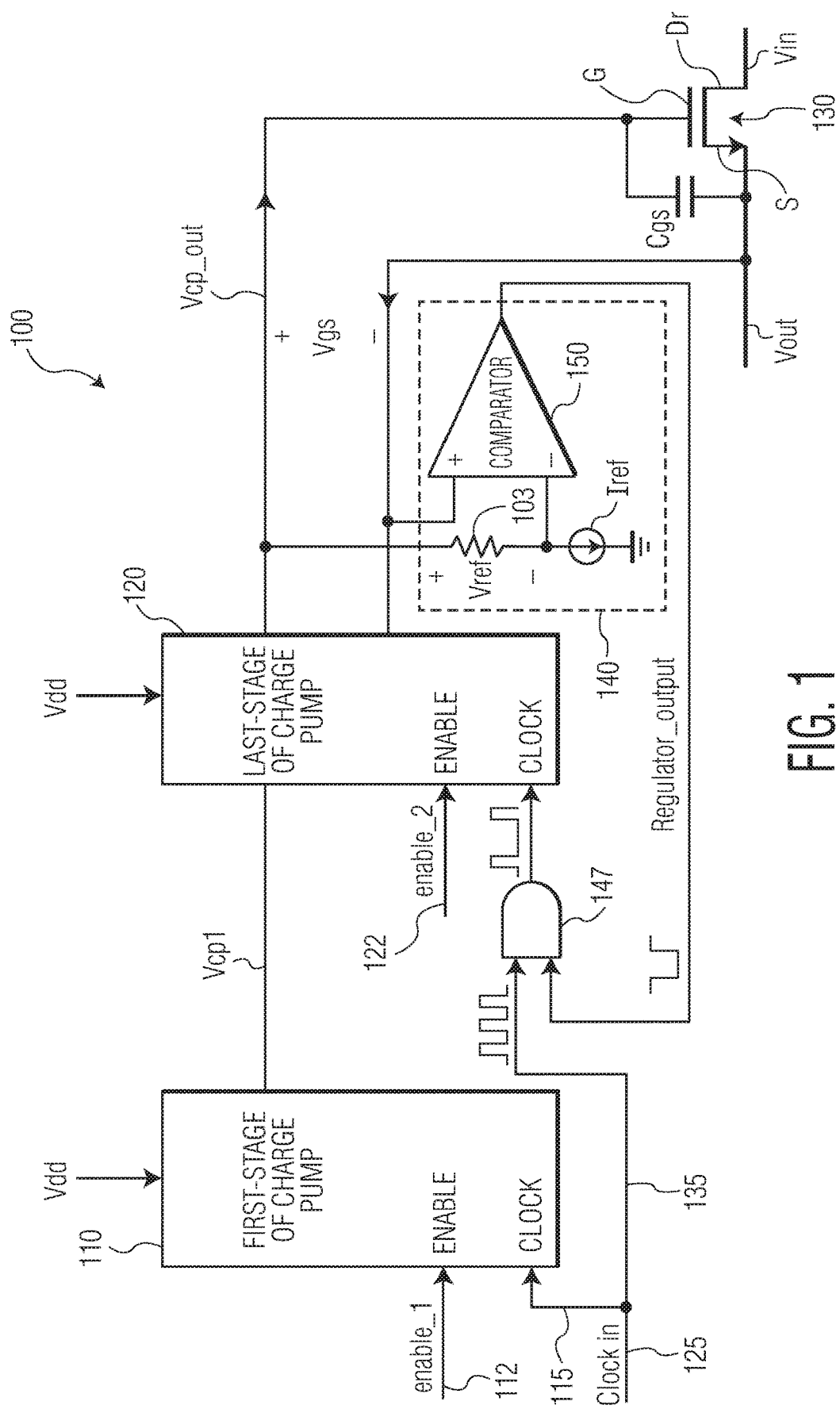
FIG. 1 illustrates a charge pump in accordance with example embodiments described herein.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or illustrated herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

In power delivery systems or data communication systems, charge pumps may be designed to bias gate-source voltages of different switches. The switches may include power switches and data switches. The switches may use NMOS transistors. In previous designs of charge pump architectures without a voltage regulator, a spread of a gate-source biasing voltage (Vgs) of a desired switch may be very large across PVT (process, voltage supply, temperature) due to gate leakage or due to charge pump inefficiency. Because of this, spread of an on-resistance (Rdson) of an NMOS transistor power switch, for example, may be very large across PVT. In order to maintain lower Rdson across PVT, NMOS transistor power switch sizes have been increased and chip sizes have been in turn, increased. In previous designs of charge pump architectures having a regulator, the regulation merely regulated an absolute value of the charge pump output voltage.

According to example embodiments described herein, a gate-source biasing voltage of an NMOS transistor switch may be regulated to provide accurate biasing. Example embodiments described herein include charge pump architectures including a first stage, a last stage of a charge pump, and a voltage regulator at an output of the last stage. When the last stage output voltage is applied to bias a gate-source voltage of an NMOS switch, the gate-source voltage of the NMOS switch is regulated by the voltage regulator to provide a desired and accurate gate-source bias voltage of the NMOS switch to achieve a fixed on-resistance (Rdson) of the NMOS switch. The regulated voltage according to example embodiments described herein may result across a wide delivery power voltage range. A voltage tolerance level of the voltage regulator may be high enough to tolerate up to a 25V delivery power voltage with extended-drain CMOS devices and differential common-gate topology.

According to example embodiments described herein, a gate-source biasing voltage of a switch is regulated by the charge pump to provide an accurate constant gate-source voltage which in turn may lead to the substantially constant Rdson for the power or data switches across wider delivery power voltage (2.5 to 25V). A substantially constant Rdson is important to enable power and data switches to prevent DC losses in power switches and attenuation across common mode voltages for the data switches. Moreover, chip sizes may also be reduced by reducing the spread of gate-source voltage and in turn Rdson.

Charge pumps according to example embodiments described herein include multiple stage charge pumps that are connected in series. A last stage may be directly connected to a high voltage output (Vcp_out) of the multi-stage charge pump and previous stages that may include intermediate stages and a first stage are disposed progressively farther from the high voltage output of the multi-stage charge pump. Depending upon a desired output voltage, more or fewer charge pumps stages may be enabled.

As illustrated in FIG. 1, a multi-stage charge pump 100 includes a set of series-connected charge pump stages 110-120. Not illustrated are one or more intermediate stages that may also be used to ramp up a voltage charge to a desired level. A supply voltage Vdd may be applied to a lower voltage input of a first stage 110, and a last stage 120 may pump charge from the first stage 110 to the last stage output 124. Selected stages may be turned on or off through enable signals 112 and 122 and through clock signals 115 and 135. The first stage 110 may be configured to output a first voltage. If there are no intermediate stages, the last stage 120 may be configured to receive the first voltage from the first stage 110 and output a second voltage. The last stage 120 may output the second voltage to a power switch or a data switch.

Each stage 110-120 operates to pump a unit of charge from a lower voltage input Vdd to the high voltage output Vcp_out with each transition of clock signals 115 and 135 applied to the respective clock input. If there are no intervening stages, the first stage 110 is configured to output a first voltage Vcp1 to the last stage 120, for the last stage 120 to build upon and output a second, or final output voltage, when enabled. The last stage 120 may output a final voltage Vcp_out to the power switch 130, and may receive an input Vout, from the source of the NMOS power switch 130. Vout may be used as a reference voltage in the last stage 120, and is used by a voltage regulator 140 for comparison purposes as described herein.

As illustrated in FIG. 1, a first stage of a charge pump may generate an output voltage according the following equation when it is enabled and when its output voltage fully comes up, $$Vcp1 = n*Vdd \qquad (1)$$

where n is a natural number, and can be 2, or 3, or 4 depending on the design. Vdd is the chip power supply (e.g., Vdd=3V, n=3, and Vcp1 is about 9V). Vcp1 can be used as a voltage power supply for externals circuits, or may be used to bias data switches on the same chip.

In previous architectures without output regulation, the output voltage would be $$Vcp\_out\_previous = Vcp1 + Vout - Voffset, \qquad (2)$$

where Vout is a source voltage of a power switch 130, and Voffset is an internal voltage offset of the design. Therefore, a gate-source bias voltage (Vgs) of the power switch 130 would be $$Vgs = Vcp1 - Voffset. \qquad (3)$$

A spread of Vcp1 and Voffset can be very large across PVT (process, voltage, temperature), and therefore, the spread of Vgs under previous conditions can be very large. In previous designs, Vgs was limited to make sure that a maximum value of Vgs was lower than the power switch gate-source breakdown voltage. Therefore, the minimal value of Vgs was small, and the on-resistance (Rdson) of the power switch was affected by the minimal value of Vgs. Rdson was therefore calculated, $$Rdson=1/[\mu n*Cox*(W/L)*(Vgs-Vthn)] \quad (4)$$

where μn is a mobility of the power switch transistor, and Cox is the gate oxide capacitance per unit area of the power switch transistor. W and L are the channel width and channel length of the power switch transistor respectively, and Vthn is a threshold voltage for power switch transistors to turned on. In order to maintain a low Rdson using this design, W/L needed to be increased, and chip size increased as well.

In the regulation circuit according to example embodiments described herein, a reference voltage Vref of a semiconductor device in which the multi-stage charge pump 100 is fabricated may be generated according to the following equation, $$Vref=R3*Iref=R3*Vbg/R=Vbg*(R3/R) \quad (5)$$

where Vbg is an accurate bandgap voltage of a semiconductor chip that holds the multi-stage charge pump 100, and R3/R is a constant number defined by the design. Therefore, Vref may be an accurate reference voltage. The voltage regulator 140 may include a comparator 150. An input to the positive (non-inverting) input of the comparator 150 is the source voltage Vs of the power or data switch 130. An input to the negative (inverting) input of the comparator 150 is Vcp_out−Vref. A difference between Vcp_out and Vs is the gate-source voltage Vgs. In the voltage regulator 140, a trip point Vout (equivalent to the source voltage) of the comparator 150 may be defined by, $$Vcp\_out-Vref=Vout \quad (6)$$

when Vcp_out−Vref is lower than Vout, the comparator 150 output is High, and the clock signal 135 is output by an AND gate 147. As a result, the last stage 120 will be enabled and Vcp_out will ramp up to a high level. The last stage 120 will ramp up to the desired voltage. When Vcp_out−Vref is higher than Vout, the comparator 150 output is Low and the clock signal 135 is not output by the AND gate 147. The last stage 120 will lose charge and Vcp_out will lower. Through repeated on and off cycles in this manner, Vcp_out−Vout will be substantially constant and defined by Vref. The substantially constant Vcp_out−Vout will therefore keep Vgs substantially constant. By keeping Vgs substantially constant, the power switch 130 may be predictable, not fluctuate, and maintain a substantially constant on-resistance in steady state. Therefore, when the multi-stage charge pump 100 is in steady state, from equation (6), Vgs is derived, $$Vgs=Vcp\_out-Vout=Vref. \quad (7)$$

Equation (7) illustrates that Vgs may be an accurate value defined by Vref. Because Vgs is regulated and is an accurate value, a minimal value of Vgs may be increased while a maximum value thereof remains lower than the power switch gate-source breakdown voltage. From these relationships chip size may be decreased while maintaining a small on-resistance of the power switch or data switch.

Also, because delivery power can be as high as 25V, for example, in a universal serial bus (USB) power delivery system, a voltage tolerance level of the voltage regulator 140 may be high enough to tolerate this level.

Figure 2:
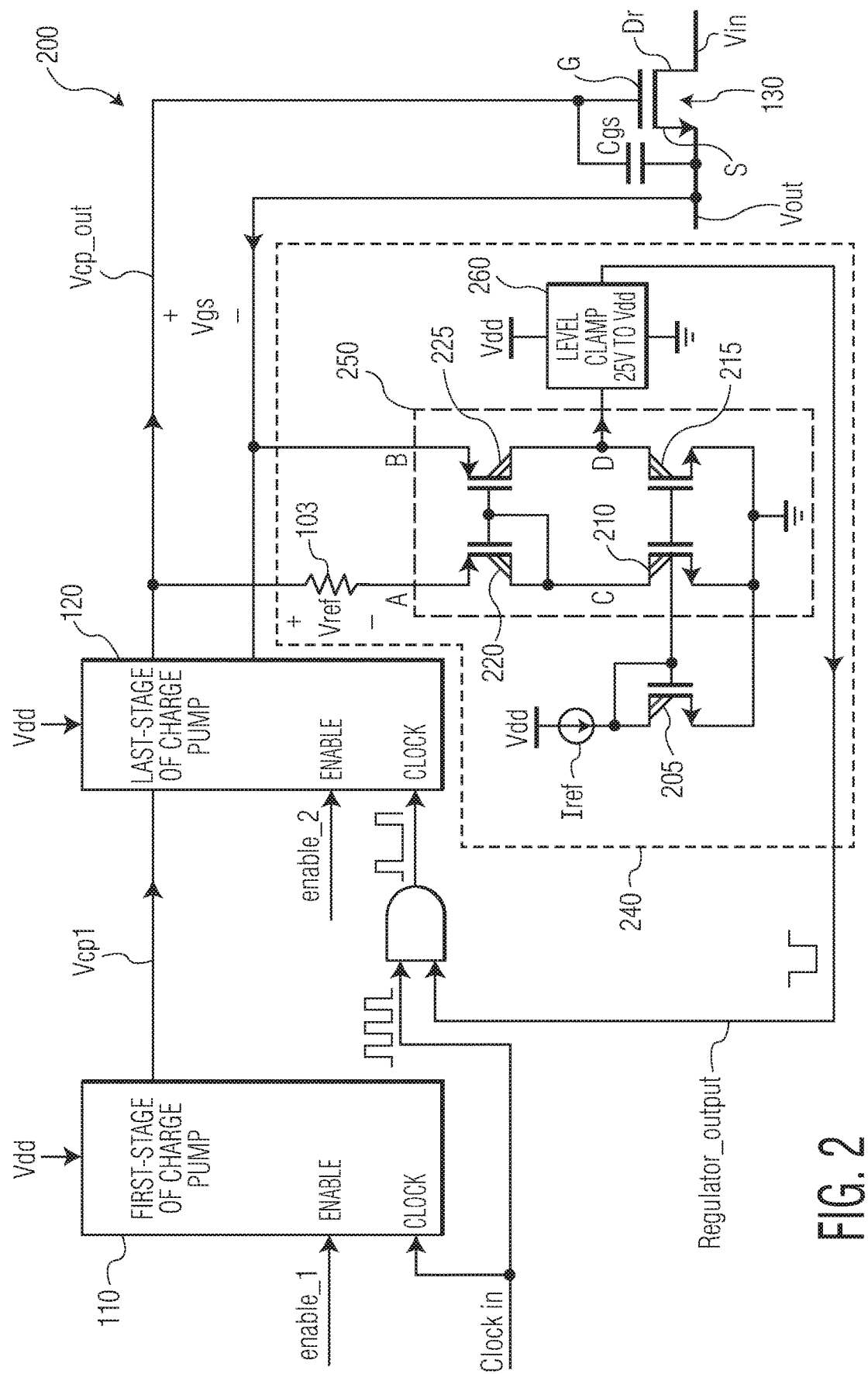
FIG. 2 illustrates a charge pump with a high voltage tolerance regulator in accordance with example embodiments described herein.

FIG. 2 illustrates a charge pump 200 with a high tolerance voltage regulator 240 in accordance with example embodiments described herein. As illustrated in FIG. 2, the high tolerance voltage regulator 240 may include extended-drain NMOS devices 205, 210, 215, extended-drain PMOS devices 220, 225, and a voltage clamp circuit 260. Transistors 210, 215, 220, and 225 may be one configuration of a comparator 250. The ratios of the transistor devices 205, 210, 215, 220, and 225 may be designed as the following, $$(W/L)205:(W/L)210:(W/L)215=1:n:m \quad (8)$$

$$(W/L)330:(W/L)335=n:m \quad (9)$$

where m and n are natural numbers. When Vgs is lower than Vref, a voltage at node A may be lower than a voltage at node B, and the comparator 250 output may be high and very close to 25V. The voltage clamp circuit 260 may clamp the 25V comparator 250 output to a Vdd voltage domain and trigger an on-action of the last stage 120 of the multi-stage charge pump 200. When Vgs is higher than Vref, voltage at node A may be higher than node B. The comparator 250 output at node D may become low, the voltage clamp circuit 260 output is low, which triggers an off action of the last stage 120 of the multi-stage charge pump 200. Triggering of an on/off action of the last stage 120 of the multi-stage charge pump 200 over time may be based on Vgs being lower or higher than Vref, which brings a constant Vgs. Therefore a substantially constant Rdson may be achieved as noted in equation (4).

Extended-drain CMOS (NMOS and PMOS) devices may be used for the transistors described herein in which CMOS devices having extended drain oxide regions configured to increase a voltage tolerance on the drain gate voltage (Vdg) and Vds, without increasing voltage tolerance on Vgs. The voltage tolerance on Vdg and Vds of an extended drain CMOS can be as high as 30V, but the voltage tolerance of Vgs may be kept to 7V.

When voltage at node A is at 25V, regarding transistor 220, the following equation may result, $$Vsd,220=Vsg,220=\{(2Iref)/[\mu n*Cox*(W/L)]\}^{1/2}+abs(Vthp) \quad (10)$$

Vsd and Vsg of transistor 220 may be much less than 7V and within the transistor 220 voltage tolerance level. Voltage at node C may be very close to 25V, but this voltage may be tolerated by the high voltage Vds and Vdg tolerance level of transistor 210.

As described earlier, when Vgs is lower than Vref, the voltage at node A is lower than the voltage at node B. The comparator 250 output at node D may be high and can be very close to 25V, but this voltage is tolerated by the high Vds and Vdg tolerance level of transistor 215. When Vgs is higher than Vref, voltage at node A is higher than node B. The comparator 250 output at node D is low, Vsd and Vdg of transistor 225 is therefore very close to 25V, but this voltage is tolerated by the high Vsd and Vdg tolerance level of Mp2.

Figure 3:
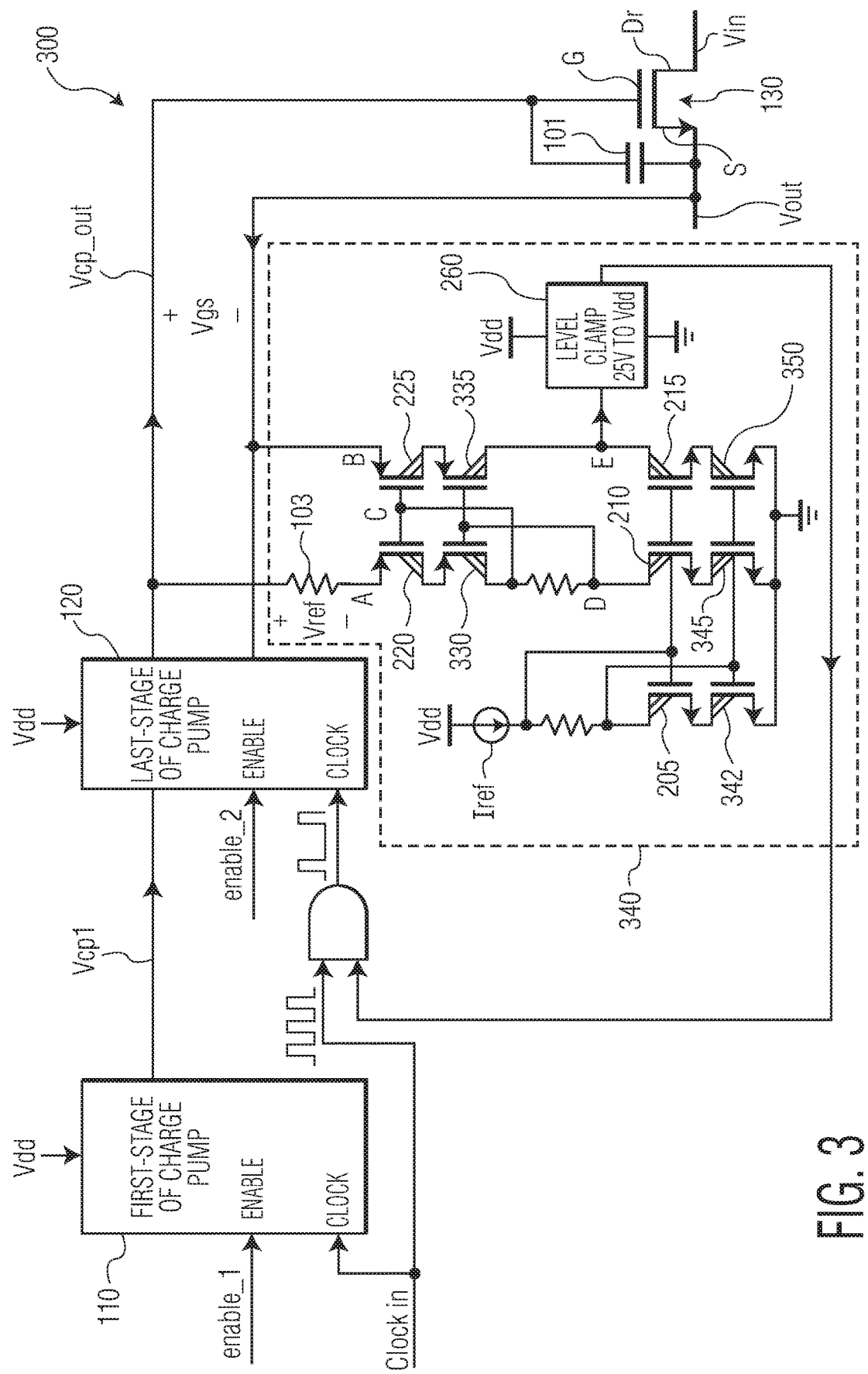
FIG. 3 illustrates a charge pump with a cascode high voltage tolerance regulator in accordance with example embodiments described herein.

FIG. 3 illustrates a charge pump 300 with a cascode high tolerance voltage regulator 340 in accordance with example embodiments described herein. The regulator 340 may use additional PMOS extended drain transistors 330 and 335, as well as NMOS transistors 342, 345, 350 to add additional accuracy and less variation in a cascode configuration. Example embodiments described herein may be applied to reduce chip silicon size, and in turn reduce chip cost.

Although the various example embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

The invention claimed is:

1. A multi-stage charge pump, comprising:
a first stage configured to generate a first output voltage;
a last stage configured to receive the first output voltage from the first stage, receive a power switch output voltage (Vout), and output a second output voltage;
a transistor switch configured to receive the second output voltage from the last stage; and
a voltage regulator circuit comprising a comparator configured to compare a difference between the second output voltage minus a fixed offset voltage set by a reference voltage and the power switch output voltage (Vout) to an output voltage of the transistor switch and configured to control the second output voltage of the last stage to maintain both a substantially constant gate-source voltage and a substantially constant on-resistance of the transistor switch.

2. The multi-stage charge pump according to claim 1, wherein the comparator further comprises:
first and second NMOS transistors; and
first and second PMOS transistors.

3. The multi-stage charge pump according to claim 1, wherein the comparator further comprises:
a cascode configuration of transistors configured to add at least one of additional accuracy and less variation to the multi-stage charge pump and to support high voltage tolerances.

4. The multi-stage charge pump according to claim 1, wherein the comparator further comprises:
a plurality of extended drain high voltage transistors configured to withstand a high output voltage from the last stage.

5. The multi-stage charge pump according to claim 1, wherein the comparator is further configured to output a high signal to enable the last stage of the multi-stage charge pump when the comparator determines that the difference between the second output voltage and the reference voltage is less than the output voltage of the transistor switch.

6. The multi-stage charge pump according to claim 1, wherein the comparator is further configured to output a low signal to disable the last stage of the multi-stage charge pump when the comparator determines that the difference between the second output voltage and the reference voltage is greater than the output voltage of the transistor switch.

7. The multi-stage charge pump according to claim 1, further comprising:
an AND gate configured to receive an output from the voltage regulator and a clock signal.

8. A method of regulating an output voltage of a multi-stage charge pump, the method comprising:
generating a first output voltage using a first stage of the multi-stage charge pump;
generating a second output voltage using a last stage of the multi-stage charge pump;
receiving, with the last stage, a power switch output voltage (Vout);
outputting the second output voltage to a transistor switch;
comparing a difference between the second output voltage minus a fixed offset voltage set by a reference voltage and the power switch output voltage (Vout) to an output voltage of the transistor switch to determine whether a last stage of the multi-stage output is enabled; and
controlling the second output voltage of the last stage to maintain both a substantially constant gate-source voltage and a substantially constant on-resistance of the transistor switch.

9. The method of claim 8, wherein when the difference between the compared output voltage of the multi-stage charge pump and the reference voltage is less than the output voltage of the transistor switch, a high signal is produced to enable the last stage of the multi-stage charge pump.

10. The method of claim 8, wherein when the difference between the compared output voltage of the multi-stage charge pump and the reference voltage is greater than the output voltage of the transistor switch, a low signal is produced to disable the last stage of the multi-stage charge pump.

11. The method of claim 8, further comprising:
generating an alternating on and off signal from a voltage regulator to alternately enable and disable the last stage.

12. The method of claim 11, further comprising:
receiving the alternating on and off signal into an AND gate to alternately enable and disable the last stage.

13. A method of operating a multi-stage charge pump, the method comprising:
generating a first output voltage using a first stage;
receiving the first output voltage from the first stage and outputting a second output voltage with a last stage;
receiving, with the last stage, a power switch output voltage (Vout);
receiving the second output voltage from the last stage to control a transistor switch; and
controlling the second output voltage of the last stage using a voltage regulator to maintain both a substantially constant gate-source voltage and a substantially constant on-resistance of the transistor switch, wherein the voltage regulator comprises a comparator configured to compare a difference between the second output voltage minus a fixed offset voltage set by a reference voltage and the power switch output voltage (Vout) to an output voltage of the transistor switch.

14. The method of claim 13, wherein the comparator includes first and second NMOS transistors, and first and second PMOS transistors.

15. The method of claim 13, wherein the comparator includes a cascode configuration of transistors configured to add at least one of additional accuracy and less variation to the multi-stage charge pump.

16. The method of claim 13, further comprising:
outputting a high signal to enable the last stage of the multi-stage charge pump after the comparator determines that the difference between the second output voltage and the reference voltage is less than the output voltage of the transistor switch.

17. The method of claim 13, further comprising:
outputting a low signal to disable the last stage of the multi-stage charge pump when it is determined that the difference between the second output voltage and the reference voltage is greater than the output voltage of the transistor switch.

18. The method of claim 13, further comprising:
receiving an output from the voltage regulator and a clock signal into a logic gate.

* * * * *